US012723132B2

(12) United States Patent
Yamaji et al.

(10) Patent No.: US 12,723,132 B2
(45) Date of Patent: Sep. 1, 2026

(54) POLYIMIDE FILM, HIGH-FREQUENCY CIRCUIT SUBSTRATE, AND FLEXIBLE ELECTRONIC DEVICE SUBSTRATE

(71) Applicant: UBE Corporation, Ube (JP)

(72) Inventors: Kosuke Yamaji, Ube (JP); Keisuke Morimoto, Ube (JP); Norio Miura, Ube (JP)

(73) Assignee: UBE Corporation, Ube (JP)

( * ) Notice: Subject to any disclaimer, the term of this patent is extended or adjusted under 35 U.S.C. 154(b) by 31 days.

(21) Appl. No.: 18/713,409

(22) PCT Filed: Nov. 30, 2022

(86) PCT No.: PCT/JP2022/044257
§ 371 (c)(1),
(2) Date: May 24, 2024

(87) PCT Pub. No.: WO2023/100951
PCT Pub. Date: Jun. 8, 2023

(65) Prior Publication Data

US 2025/0043077 A1 Feb. 6, 2025

(30) Foreign Application Priority Data

Nov. 30, 2021 (JP) ................................ 2021-194964

(51) Int. Cl.

*C08G 73/10* (2006.01)
*C08J 5/18* (2006.01)
*H05K 1/02* (2006.01)
*H05K 1/03* (2006.01)

(52) U.S. Cl.

CPC ..... *C08G 73/1042* (2013.01); *C08G 73/1071* (2013.01); *C08J 5/18* (2013.01); *H05K 1/0346* (2013.01); *C08J 2379/08* (2013.01); *H05K 1/0237* (2013.01); *H05K 2201/0154* (2013.01)

(58) Field of Classification Search

CPC .... C08G 73/1042; C08G 73/1071; C08J 5/18; C08J 2370/08; H05K 1/0237; H05K 1/0346; H05K 2201/0154

See application file for complete search history.

(56) References Cited

U.S. PATENT DOCUMENTS

2021/0283882 A1* 9/2021 Kohama ................ B32B 27/20

FOREIGN PATENT DOCUMENTS

| | | | |
|---|---|---|---|
| JP | S61-060725 | A | 3/1986 |
| JP | 2012-035583 | A | 2/2012 |
| JP | 2012-102155 | A | 5/2012 |
| WO | WO 2014/199965 | A1 | 12/2014 |
| WO | WO 2015/129780 | A1 | 9/2015 |
| WO | WO 2016/056626 | A1 | 4/2016 |
| WO | WO 2018/079710 | A1 | 5/2018 |
| WO | WO 2020/027249 | A1 | 2/2020 |

OTHER PUBLICATIONS

Machine Translation of JP 2012-035583 A (Year: 2012).*
International Search Report in PCT/JP2022/044257, dated Feb. 21, 2023.

* cited by examiner

*Primary Examiner* — Sathavaram I Reddy
(74) *Attorney, Agent, or Firm* — Knobbe, Martens, Olson & Bear, LLP

(57) ABSTRACT

A polyimide film including a polyimide prepared by reacting a tetracarboxylic acid component with a diamine component containing 4,4"-diamino-p-terphenyl, wherein the polyimide film has a glass transition temperature of higher than 290° C., and has a coefficient of linear expansion in the temperature range of 50° C. to 200° C. of 10 ppm/K or less.

15 Claims, No Drawings

POLYIMIDE FILM, HIGH-FREQUENCY CIRCUIT SUBSTRATE, AND FLEXIBLE ELECTRONIC DEVICE SUBSTRATE

This application is the U.S. National Phase under 35 U.S.C. § 371 of International Application PCT/JP2022/044257, filed Nov. 30, 2022, which claims priority to Japanese Patent Application No. 2021-194964, filed Nov. 30, 2021, the entire content of which is incorporated herein by reference.

TECHNICAL FIELD

The present invention relates to a polyimide film, and particularly relates to a polyimide film which can be suitably used in high-frequency circuit substrates or substrates for flexible electronic displays, and a polyimide precursor solution for producing the polyimide film.

BACKGROUND ART

Polyimide films, which have excellent heat resistance and mechanical properties, are widely used as a material for circuit substrates on which wirings for a variety of electronic devices are formed. Moreover, applications of polyimide precursor solutions as raw materials for polyimide films are extended to development of a material for a substrate for a flexible electronic device, which is a substrate for forming electronic elements such as TFTs.

With an increase in frequency associated with high-speed signal transmission in electronic devices, a reduction in dielectric constant and a reduction in dielectric loss tangent are strongly demanded for materials for circuit substrates to minimize transmission loss.

To satisfy such demands, Patent Document 1 discloses a polyimide film for a metal laminate plate having a dielectric constant and a dielectric loss tangent reduced by use of 4,4"-diamino-p-terphenyl (hereinafter, also referred to as "DATP") as a diamine component, and a polyimide-metal laminate including the polyimide film.

For substrate materials for flexible electronic devices, in order to provide flexible displays, polyimides having excellent various physical properties have been examined as a material alternative to glass as a traditional substrate material for flexible electronic devices. Unfortunately, those polyimides have high coefficient of linear expansion and insufficient dimensional stability.

Patent Documents 2 to 4 each disclose a method of reducing the coefficient of linear expansion of polyimide by use of DATP as a diamine component. Specifically, Patent Document 2 discloses a composition for forming a resin thin film, the composition being a blend of two or more specific polyamic acids prepared using DATP. Patent Document 3 discloses a resin composition for a display substrate, comprising a polyamic acid prepared by polymerizing 3,3'-4,4'-biphenyltetracarboxylic dianhydride and two or more diamines containing DATP as an essential component. Patent Document 4 discloses a resin composition for a display substrate, comprising a polyamic acid prepared by polymerizing pyromellitic acid, DATP, and p-phenylenediamine.

RELATED ART DOCUMENTS

Patent Documents

Patent Document 1: WO 2018/079710
Patent Document 2: WO 2016/056626
Patent Document 3: WO 2015/129780
Patent Document 4: WO 2014/199965

SUMMARY OF THE INVENTION

Problem to be Solved by the Invention

Although the materials disclosed in these Patent Documents 1 to 4 may have physical properties satisfying certain aspects such as dielectric loss tangent or coefficient of linear expansion, these need to have higher levels of heat resistance and dimensional stability for practical use. Thus, a major object of the present invention is to provide a polyimide film having high heat resistance and high dimensional stability at the same time and having high practicality suitable for industrial production. Another object thereof is to provide a polyimide film which has high heat resistance and excellent high-temperature dimensional stability as well as low saturated water absorption and/or low water vapor permeability and is suitable for a material for circuit substrates and/or a material for display substrates. Further another object thereof is to provide a polyimide precursor solution, for example, having high storage stability to produce a polyimide film having high heat resistance and excellent high-temperature dimensional stability at the same time and having high practicality.

Means for Solving Problems

The present invention particularly relates to the following aspects.

1. A polyimide film comprising a polyimide prepared by reacting a tetracarboxylic acid component with a diamine component containing 4,4"-diamino-p-terphenyl, wherein the polyimide film has a glass transition temperature of higher than 290° C., and has a coefficient of linear expansion in the temperature range of 50° C. to 200° C. of 10 ppm/K or less.

2. The polyimide film according to [1] above, wherein the polyimide film has a saturated water absorption of 1% or less.

3. The polyimide film according to [1] or [2] above, wherein the polyimide film has a water vapor permeability coefficient of 0.1 g·mm/($m^2$·24 h) or less.

4. The polyimide film according to any one of [1] to [3] above, wherein the polyimide film has a coefficient of linear expansion in the temperature range of 50° C. to 500° C. of −1.0 ppm/K or more and less than 0.5 ppm/K.

5. The polyimide film according to any one of [1] to [4] above, wherein the diamine component is a diamine component containing more than 50 mol % of 4,4"-diamino-p-terphenyl.

6. The polyimide film according to any one of [1] to [5] above, wherein the tetracarboxylic acid component is a tetracarboxylic acid component containing two or more tetracarboxylic dianhydrides selected from the group consisting of 3,3',4,4'-biphenyltetracarboxylic dianhydride, pyromellitic dianhydride, and 4,4'-oxydiphthalic dianhydride.

7. The polyimide film according to any one of [1] to [6] above, wherein the tetracarboxylic acid component is a tetracarboxylic acid component containing 50 mol % or more of 3,3',4,4'-biphenyltetracarboxylic dianhydride, and further containing one or more tetracarboxylic dianhydrides selected from the group consisting of pyromellitic dianhydride and 4,4'-oxydiphthalic dianhydride.

8. A polyimide precursor solution for producing the polyimide film according to any one of [1] to [7] above.

9. A polyimide film for a metal laminate, comprising a metal adhesive layer disposed on the polyimide film according to any one of [1] to [7] above.

10. A polyimide-metal laminate, comprising the polyimide film for a metal laminate according to [9] above and a metal layer laminated on the polyimide film.

11. A high-frequency circuit substrate, comprising the polyimide-metal laminate according to above.

12. A laminate, in which the polyimide film according to any one of [1] to [7] above and a glass substrate are laminated.

13. A substrate for a flexible electronic device, comprising the polyimide film according to any one of [1] to [7] above or the laminate according to above.

14. A substrate for a flexible electronic device, comprising the substrate for a flexible electronic device according to above and an element on the substrate.

15. A method of producing the flexible electronic device according to above, comprising an application step of applying the polyimide precursor solution according to [8] above onto a carrier substrate, a film forming step of forming a polyimide film by a heat treatment of the carrier substrate onto which the polyimide precursor solution is applied, an element forming step of forming an element on the polyimide film, and a peeling step of peeling the polyimide film including the element formed thereon from the carrier substrate.

Effects of Invention

The present invention can provide a polyimide film having high heat resistance and high dimensional stability at the same time and having high practicality. Preferably, the present invention can provide a polyimide film which has high heat resistance and excellent high-temperature dimensional stability as well as low saturated water absorption and/or low water vapor permeability and is suitable for a material for a circuit substrate and/or a material for a display substrate. In addition, the present invention can provide a polyimide precursor composition for implementing these polyimide films.

DESCRIPTION OF EMBODIMENTS

The present invention relates to a polyimide film comprising a polyimide prepared by polymerizing a tetracarboxylic acid component and a diamine component containing 4,4''-diamino-p-terphenyl (DATP), wherein the polyimide film has a glass transition temperature of higher than 290° C., and has a coefficient of linear expansion in the temperature range of 50 to 200° C. of 10 ppm/K or less. Hereinafter, a polyimide film, a polyimide precursor composition, a circuit substrate, and a substrate for a flexible device will be described in this order.

<Polyimide Film>

The polyimide film according to the present invention comprises a polyimide prepared by polymerizing a tetracarboxylic acid component and a diamine component, and the diamine component contains DATP as an essential component. For example, the thickness of the polyimide film is preferably 1 μm or more and 500 μm or less, more preferably 5 μm or more, particularly preferably 10 μm or more, and 300 μm or less, 200 μm or less, particularly preferably 100 μm or less. The thickness of the polyimide film can be appropriately adjusted according to its applications or desired physical properties.

The tetracarboxylic acid component used in the present invention is not particularly limited, and traditionally known tetracarboxylic acid and derivatives thereof and tetracarboxylic anhydrides can be used. Use of tetracarboxylic dianhydrides is preferred from the viewpoint of reactivity during polymerization. Although tetracarboxylic dianhydrides will now be described as a representative of the tetracarboxylic acid component, it is not intended that the tetracarboxylic acid component is limited to tetracarboxylic dianhydrides.

The tetracarboxylic dianhydrides are preferably aromatic tetracarboxylic dianhydrides (general names for tetracarboxylic dianhydrides having an aromatic group) and alicyclic tetracarboxylic dianhydrides (general names for tetracarboxylic dianhydrides having an alicyclic structure) from the viewpoint of heat resistance and dimensional stability, although not particularly limited thereto. Examples of aromatic tetracarboxylic dianhydrides include rigid aromatic tetracarboxylic dianhydrides such as 3,3',4,4'-biphenyltetracarboxylic dianhydride, pyromellitic dianhydride (1,2,4,5-benzenetetracarboxylic dianhydride), 2,3,6,7-naphthalenetetracarboxylic dianhydride, and p-terphenyltetracarboxylic dianhydride; flexible aromatic tetracarboxylic dianhydrides such as 2,3,3',4-biphenyltetracarboxylic dianhydride, 3,3',4,4'-benzophenonetetracarboxylic dianhydride, diphenylsulfonetetracarboxylic dianhydride, m-terphenyltetracarboxylic dianhydride, and oxydiphthalic dianhydride; and fluorine-substituted aromatic dianhydrides such as 4,4'-(2,2-hexafluoroisopropylidene)diphthalic dianhydride. Examples of alicyclic tetracarboxylic dianhydrides suitably include alicyclic dianhydrides such as cyclobutane-1, 2, 3, 4-tetracarboxylic dianhydride and 1,2,4,5-cyclohexanetetracarboxylic dianhydride; and the like.

Among the tetracarboxylic dianhydrides, use of 3,3',4,4'-biphenyltetracarboxylic dianhydride, pyromellitic dianhydride, 3,3',4,4'-benzophenonetetracarboxylic dianhydride, oxydiphthalic dianhydride, diphenylsulfonetetracarboxylic dianhydride, p-terphenyltetracarboxylic dianhydride, or m-terphenyltetracarboxylic dianhydride results in a polyimide that can provide a polyimide film having higher heat resistance. Among these, use of 3,3',4,4'-biphenyltetracarboxylic dianhydride, pyromellitic dianhydride, 3,3',4,4'-benzophenonetetracarboxylic dianhydride, or oxydiphthalic dianhydride is preferred.

Among the tetracarboxylic dianhydride, use of 3,3',4,4'-biphenyltetracarboxylic dianhydride, pyromellitic dianhydride, 3,3',4,4'-benzophenonetetracarboxylic dianhydride, oxydiphthalic dianhydride, 4,4'-(2,2-hexafluoroisopropylidene)diphthalic dianhydride, diphenylsulfonetetracarboxylic dianhydride, p-terphenyltetracarboxylic dianhydride, m-terphenyltetracarboxylic dianhydride, cyclobutane-1, 2, 3, 4-tetracarboxylic dianhydride, or 1,2,4,5-cyclohexanetetracarboxylic dianhydride results in a polyimide that provides a polyimide film having higher dimensional stability. Among these, use of 3,3',4,4'-biphenyltetracarboxylic dianhydride, pyromellitic dianhydride, or 3,3',4,4'-benzophenonetetracarboxylic dianhydride is preferred.

Among the tetracarboxylic dianhydrides, use of 3,3',4,4'-biphenyltetracarboxylic dianhydride, 3,3',4,4'-benzophenonetetracarboxylic dianhydride, oxydiphthalic dianhydride, 4,4'-(2,2-hexafluoroisopropylidene)diphthalic dianhydride, diphenylsulfonetetracarboxylic dianhydride, cyclobutane-1, 2, 3, 4-tetracarboxylic dianhydride, or 1,2,4, 5-cyclohexanetetracarboxylic dianhydride results in a polyimide that provides a polyimide film having low absorption at saturation. Among these, use of 3,3',4,4'-biphenyltetracarboxylic dianhydride, oxydiphthalic dianhydride, 4,4'-(2,2-hexafluoroisopropylidene)diphthalic dianhydride, cyclobutane-1,2,3,4-tetracarboxylic dianhydride, or 1,2,4,5-cyclohexanetetracarboxylic dianhydride is preferred.

Among the tetracarboxylic dianhydrides, use of 3,3',4,4'-biphenyltetracarboxylic dianhydride, pyromellitic dianhydride, 3,3',4,4'-benzophenonetetracarboxylic dianhydride, oxydiphthalic dianhydride, 4,4'-(2,2-hexafluoroisopropylidene)diphthalic dianhydride, diphenylsulfonetetracarboxylic dianhydride, p-terphenyltetracarboxylic dianhydride, or m-terphenyltetracarboxylic dianhydride results in a polyimide that provides a polyimide film having a low water vapor permeability coefficient. Among these, use of 3,3',4,4'-biphenyltetracarboxylic dianhydride, pyromellitic dianhydride, 3,3',4,4'-benzophenonetetracarboxylic dianhydride, or oxydiphthalic dianhydride is preferred.

From the viewpoint of viscosity stability of a polyamic acid, the tetracarboxylic dianhydride preferably contains 3,3',4,4'-biphenyltetracarboxylic dianhydride.

Use of two or more of these tetracarboxylic dianhydrides in combination is preferred, and use of two of them in combination is particularly preferred. Use of two or more of the tetracarboxylic dianhydrides in combination results in a polyimide film having heat resistance and dimensional stability at higher levels at the same time. In addition, a well-balanced polyimide film having low water absorption and a low water vapor permeability coefficient can be obtained.

When two or more tetracarboxylic dianhydrides are used in combination, use of at least one or more dianhydrides selected from the group consisting of 3,3',4,4'-biphenyltetracarboxylic dianhydride, pyromellitic dianhydride, and oxydiphthalic dianhydride is preferred from the viewpoint of heat resistance and dimensional stability. Needless to say, two or more of them may be used in combination. Among these, use of at least two or more dianhydrides selected from the group consisting of 3,3',4,4'-biphenyltetracarboxylic dianhydride, pyromellitic dianhydride, and oxydiphthalic dianhydride is preferred, use of a mixture of 3,3',4,4'-biphenyltetracarboxylic dianhydride and another tetracarboxylic dianhydride is more preferred, and use of a mixture of 3,3',4,4'-biphenyltetracarboxylic dianhydride and at least one or more dianhydrides selected from the group consisting of pyromellitic dianhydride and oxydiphthalic dianhydride is particularly preferred.

When 3,3',4,4'-biphenyltetracarboxylic dianhydride is used in combination with another tetracarboxylic dianhydride, 3,3',4,4'-biphenyltetracarboxylic dianhydride is used in a proportion of preferably 50 mol % or more, more preferably 60 mol % or more and preferably 90 mol % or less, more preferably 80 mol % or less relative to the total tetracarboxylic acid components.

The diamine component used in the present invention contains 4,4"-diamino-p-terphenyl (hereinafter, also referred to as "DATP") as an essential component. From the viewpoint of dimensional stability and heat resistance, preferably 50 mol % or more, more preferably 70 mol % or more, still more preferably 90 mol %, particularly preferably 100 mol % of DATP is contained relative to the total diamine components.

In the present invention, a diamine component other than 4,4"-diamino-p-terphenyl (DATP) can be used in combination to enhance the function of the polyimide film obtained by using DATP as the diamine component or impart a different function to the polyimide film. The diamine used in combination is used in an amount in the range of preferably 50 mol % or less, more preferably 30 mol % or less, particularly preferably 10 mol % or less relative to the total diamine components. Two or more diamine components other than DATP may be used in combination.

Examples of diamine components usable in combination with DATP suitably include, but not particularly limited to, aromatic diamines having an aromatic group, such as 4,4'-diaminodiphenyl ether, 2,2'-dimethylbenzidine, 4,4'-diaminodiphenylmethane, 4,4'-diamino-1,2-diphenylethane, p-phenylenediamine, m-phenylenediamine, 2,4-diaminotoluene, 1,3-bis(4-aminophenoxy)benzene, 1,4-bis(4-aminophenoxy)benzene, 2,2-bis[4-(4-aminophenoxy)phenyl]propane, m-xylylenediamine, p-xylylenediamine, 2,2-bis[4-(4-aminophenoxy)phenyl]propane, 4,4'-methylenebis(2,6-xylidine), α,α'-bis(4-aminophenyl)-1,4-diisopropylbenzene, 2,2'-dimethyl-4,4'-aminobiphenyl, 3,3'-dimethyl-4,4'-aminobiphenyl, and 2,2'-ethylenedianiline; alicyclic diamines having an alicyclic structure, such as 1,4-1,4-diamino-2-isopropylcyclohexane, 1,4-diamino-2-n-butylcyclohexane, 1,4-diamino-2-isobutylcyclohexane, 1,4-diamino-2-sec-butylcyclohexane, 1,4-diamino-2-tert-butylcyclohexane, 1,2-diaminocyclohexane, 1,3-diaminocyclobutane, 1,4-bis(aminomethyl)cyclohexane, 1,3-bis(aminomethyl)cyclohexane, diaminobicycloheptane, diaminomethylbicycloheptane, diaminooxybicycloheptane, diaminomethyloxybicycloheptane, isophoronediamine, diaminotricyclodecane, diaminomethyltricyclodecane, bis(aminocyclohexyl) methane, bis(aminocyclohexyl) isopropylidene, 6,6'-bis(3-aminophenoxy)-3,3,3',3'-tetramethyl-1,1'-spirobiindane, and 6,6'-bis(4-aminophenoxy)-3,3,3',3'-tetramethyl-1,1'-spirobiindane; fluorine-based diamines containing a fluorine atom, such as 2,2'-bis(trifluoromethyl)-4,4'-diaminobiphenyl, 2,2'-bis(3-amino-4-hydroxyphenyl) hexafluoropropane, 2,3,5,6-tetrafluoro-1,4-diaminobenzene, 2,4,5,6-tetrafluoro-1,3-diaminobenzene, 2,3,5,6-tetrafluoro-1,4-benzene (dimethaneamine), 2,2'-difluoro-(1,1'-biphenyl)-4,4'-diamine, 2,2',6,6'-tetrafluoro-(1,1'-biphenyl)-4,4'-diamine, 4,4'-diaminooctafluorobiphenyl, 2,2-bis(4-aminophenyl) hexafluoropropane, 4,4'-oxybis(2,3,5,6-tetrafluoroaniline), 3,3'-bis(trifluoromethyl)-4,4'-diaminobiphenyl, 4,4'-diamino-2,2'-bis(trifluoromethyl)diphenyl ether, 1,4-bis[4-amino-2-(trifluoromethyl) phenoxy]benzene, 2,2-bis[4-[4-amino-2-(trifluoromethyl) phenoxy]hexafluoropropane, 3,5-diaminobenzene trifluoride, and 4,4-diamino-2-(trifluoromethyl)diphenyl ether; and ester bond-containing diamines, such as 4-aminophenyl 4-aminobenzoate, bis(4-aminophenyl) terephthalate, and biphenyl-4,4'-dicarboxylic acid bis(4-aminophenyl) ester.

Among these diamine components, use of an aromatic diamine results in a polyimide that provides a polyimide film having high heat resistance. Among these, use of 4,4'-diaminodiphenyl ether, 2,2'-dimethylbenzidine, 4,4'-diaminodiphenylmethane, 4,4'-diamino-1,2-diphenylethane, p-phenylenediamine, or 2,2-bis[4-(4-aminophenoxy)phenyl]propane is preferred.

Among these diamine components, use of an alicyclic diamine results in a polyimide that provides a polyimide film having high dimensional stability. Among these, use of 1,4-1,4-diamino-2-isopropylcyclohexane, 1,4-diamino-2-n-butylcyclohexane, 1,4-diamino-2-isobutylcyclohexane, 1,4-diamino-2-sec-butylcyclohexane, or 1,4-diamino-2-tert-butylcyclohexane is particularly preferred.

Among these diamines, use of an ester bond-containing diamine results in a polyimide that provides a polyimide film having a low water absorption. Among these, 4-aminophenyl 4-aminobenzoate, bis(4-aminophenyl) terephthalate, biphenyl-4,4'-dicarboxylic acid bis(4-aminophenyl) ester, and terphenyl-4,4'-dicarboxylic acid bis(4-aminophenyl) ester are preferred.

The polyimide film according to the present invention can contain a filler such as a fine inorganic filler or an organic filler, as needed. Examples of the shape of the inorganic filler include particulate shapes, flat shapes, and the like. Examples of the inorganic filler include fine particles of inorganic oxide powders such as titanium dioxide powder, silicon dioxide (silica) powder, magnesium oxide powder, aluminum oxide (alumina) powder, and zinc oxide powder; fine particles of inorganic nitrides powders such as silicon nitride powder and titanium nitride powder; fine particles of inorganic carbide powders such as silicon carbide powder; fine particles of inorganic salt powders such as calcium carbonate powder, calcium sulfate powder, and barium sulfate powder. Furthermore, a needle-like filler such as strontium carbonate or a needle-like mineral may be contained. Examples of the organic filler include polyimide particles, silicone particles, particles of thermosetting resins completely thermally cured, and the like. These fillers may be used in combination. The amount and shape (size, aspect ratio) of the filler to be used can be selected according to the purpose of use. These fillers may be homogeneously dispersed using a known method.

The amount of the filler to be used can be selected according to the application, and for example, the filler can be used in an amount in the range of 50% by mass or less, preferably 1% by mass or more and 40% by mass or less based on the weight of the polyimide film.

The polyimide film according to the present invention has high heat resistance. Specifically, the polyimide film has a glass transition temperature of higher than 290° C., preferably 300° C. or more, more preferably 320° C. or more, particularly preferably 350° C. or more. Although the upper Limit of the glass transition temperature is not particularly limited, it is preferably 600° C. or less. Here, the glass transition temperature of the polyimide film is a tan δ peak temperature obtained by dynamic viscoelastic analysis of the polyimide film. In this specification, the expression that the glass transition temperature is "more than 500° C." indicates a state where the glass transition temperature is present at a temperature higher than 500° C. and is unmeasurable by a measurement apparatus, or a state where the polyimide film reaches the decomposition temperature before it reaches the glass transition temperature. As the apparatus for determining the dynamic viscoelasticity, a known measurement apparatus can be used.

The polyimide film according to the present invention has high dimensional stability. Specifically, the coefficient of linear expansion in the temperature range of 50 to 200° C. is 10 ppm/K or less, preferably 9 ppm/K or less, more preferably 8 ppm/K or less, particularly preferably 6 ppm/K or less. Although the lower limit of the coefficient of linear expansion in the temperature range of 50 to 200° C. is not particularly limited, it is −5 ppm/K or more, preferably −1 ppm/K or more. In addition, the coefficient of linear expansion in the temperature range of 50 to 500° C. (also referred to as "high-temperature dimensional stability" in this specification) particularly preferably satisfies-1.0 ppm/K or more and less than +0.5 ppm/K. The coefficient of linear expansion in the temperature range of 50 to 500° C. is preferably −0.95 ppm/K or more and +0.4 ppm/K or less, more preferably −0.8 ppm/K or more and +0.2 ppm/K or less. Here, the coefficient of linear expansion in the temperature range of 50 to 200° C. and the coefficient of linear expansion in the temperature range of 50 to 500° C. of the polyimide film can be determined by measurement of the polyimide film using a known TMA measurement apparatus. Specifically, the coefficient of linear expansion in the temperature range of 50 to 200° C. is determined as follows: first, primary heating for relaxing heat shrinkage during film formation is performed by heating a polyimide film to 300° C. at a heating rate of 20° C./min; thereafter, heat is dissipated from the polyimide film until it reaches room temperature, and then secondary heating is performed at a heating rate of 20° C./min; at this time, measurement is performed using a TMA measurement apparatus, and the coefficient of linear expansion can be calculated from the TMA curve from 50° C. to 200° C. The coefficient of linear expansion in the temperature range of 50 to 500° C. is determined as follows: first, primary heating for relaxing heat shrinkage during film formation is performed by heating a polyimide film to 500° C. at a heating rate of 20° C./min; thereafter, heat is dissipated from the polyimide film until it reaches room temperature, and then secondary heating is performed at a heating rate of 20° C./min; at this time, measurement is performed using a TMA measurement apparatus, and the coefficient of linear expansion can be calculated from the TMA curve from 50° C. to 500° C.

The polyimide film according to the present invention has a saturated water absorption of preferably 1.3% by mass or less, more preferably 1.1% by mass or less, particularly preferably 0.9% by mass or less. The lower limit of the saturated water absorption is preferably 0.01% by mass or more, although not particularly limited thereto. Here, the "saturated water absorption" of the polyimide film used in the present invention refers to a saturated water absorption of the polyimide film at a water temperature of 23° C. The saturated water absorption can be measured by any method: for example, a polyimide film having a thickness of 25 μm is immersed in water at 23° C. for 24 hours or longer to cause the polyimide film absorb water to saturation, and the saturated water absorption can be calculated from the absolute dry weight and the weight at saturation of water absorption using the following formula:

$$\text{saturated water absorption (\%)} = [(\text{weight after saturation of water absorption}) - (\text{absolute dry weight})]/(\text{absolute dry weight}) \times 100$$

A saturated water absorption of the polyimide film within the ranges above is preferred because the transmission loss can be reduced.

Further, the polyimide film according to the present invention has a water vapor permeability coefficient of preferably 0.3 g·mm/($m^2$·24 h) or less, more preferably 0.1 g·mm/($m^2$·24 h) or less, particularly preferably 0.05 g·mm/($m^2$·24 h) or less. The lower limit of the water vapor permeability coefficient is preferably 0.001 g·mm/($m^2$·24 h) or more, although not particularly limited. Here, the water vapor permeability of the polyimide film is a value obtained in measurement at 40° C. and a relative humidity of 90% by the method B specified in JIS K7129. The water vapor permeability coefficient is calculated by multiplying the obtained water vapor permeability by the film thickness as in the following formula:

$$\text{water vapor permeability coefficient} = \text{water vapor permeability} \times \text{film thickness}$$

A water vapor permeability coefficient of the polyimide film within the ranges above is preferred because the polyimide film can have high dimensional stability even under a highly humid environment with small fluctuation in mechanical physical properties.

Generally, the physical properties of the polyimide film such as the glass transition temperature and the coefficient of linear expansion can be each independently adjusted using traditionally known methods. On the other hand, adjustment to satisfy these physical properties at the same time may need a technically special condition for production in some cases, and leads to complexity in the entire production process. In contrast, in the polyimide film according to the present invention, by selecting and using DATP as the diamine component, these physical properties can be satisfied at the same time without largely depending on the production process.

From the viewpoint of the glass transition temperature and the coefficient of linear expansion, one example of a preferred combination of the tetracarboxylic acid component and the diamine component includes a combination of 10 mol % to 90 mol % of 3,3',4,4'-biphenyltetracarboxylic dianhydride in the total tetracarboxylic acid components and 90 mol % to 10 mol % of pyromellitic dianhydride in the tetracarboxylic acid components as the tetracarboxylic acid components and DATP as the diamine component.

Further, other preferred examples of a combination of the tetracarboxylic acid component and the diamine component in the present invention include (I) a combination of 10 mol % to 100 mol %, more preferably 90 mol % to 99.5 mol % of pyromellitic anhydride in the total tetracarboxylic acid components and 90 to 0 mol %, more preferably 10 mol % to 0.5 mol % of 2,3,3',4-biphenylphenyltetracarboxylic dianhydride in the total tetracarboxylic acid components as the tetracarboxylic acid components and DATP as the diamine component, and (II) a combination of 100 mol % of pyromellitic dianhydride in the total tetracarboxylic acid components as the tetracarboxylic acid component and 10 mol % to 100 mol % of meta-phenylenediamine and 90 mol % to 0 mol % of DATP in the total diamine components as the diamine component. To be noted, these are only illustrations of the combination of the tetracarboxylic acid component and the diamine component for obtaining a polyimide film having a high glass transition temperature and a low coefficient of linear expansion, and these combinations of the tetracarboxylic acid component and the diamine component should not be construed as limitations to the composition of the polyimide film according to the present invention.

Further, other preferred examples of a combination of the tetracarboxylic acid component and the diamine component in the present invention include (I) a combination of 50 mol % to 90 mol %, more preferably 80 mol % to 90 mol % of 3,3',4,4'-biphenyltetracarboxylic dianhydride in the total tetracarboxylic acid components and 50 mol % to 10 mol %, more preferably 20 mol % to 10 mol % of oxydiphthalic dianhydride in the total tetracarboxylic acid components as the tetracarboxylic acid components and DATP as the diamine component, (II) a combination of 70 mol % to 90 mol % of pyromellitic dianhydride in the total tetracarboxylic acid components and 30 to 10 mol % of oxydiphthalic dianhydride in the tetracarboxylic acid components as the tetracarboxylic acid components and DATP as the diamine component, (III) a combination of 30 mol % to 60 mol % of 3,3',4,4'-biphenyltetracarboxylic dianhydride in the total tetracarboxylic acid components, 20 mol % to 40 mol % of pyromellitic dianhydride in the total tetracarboxylic acid components, and 20 to 40 mol % of oxydiphthalic dianhydride in the total tetracarboxylic acid components as the tetracarboxylic acid components, and DATP as the diamine component, (IV) a combination of 10 mol % to 90 mol %, more preferably 30 mol % to 70 mol % of 3,3',4,4'-biphenyltetracarboxylic dianhydride in the total tetracarboxylic acid components and 90 mol % to 10 mol %, more preferably 70 mol % to 30 mol % of pyromellitic dianhydride in the total tetracarboxylic acid components as the tetracarboxylic acid components, and 10 mol % to 70 mol % of DATP in the total diamine components and 90 mol % to 30 mol % of p-phenylenediamine in the total diamine components, and the like. To be noted, these are only illustrations of the combination of the tetracarboxylic acid component and the diamine component for obtaining a polyimide film having a high glass transition temperature and a low coefficient of linear expansion, and these combinations of the tetracarboxylic acid component and the diamine component should not be construed as limitations to the composition of the polyimide film according to the present invention.

For example, the tetracarboxylic acid components can have the following configuration from the viewpoint of providing high heat resistance and dimensional stability as well as low saturated water absorption and/or low water vapor permeability and thus obtaining a product more suitable for applications to circuit substrate materials, but any other configuration can be used.

First, two tetracarboxylic acid components, i.e., 3,3',4,4'-biphenyltetracarboxylic dianhydride and pyromellitic dianhydride are used in combination in a molar ratio of 3, 3',4, 4 '-biphenyltetracarboxylic dianhydride:pyromellitic dianhydride of preferably 10:90 to 80:20, more preferably 20:80 to 60:40, preferably 30:70 to 50:50.

Second, two tetracarboxylic acid components, i.e., 3, 3', 4,4'-biphenyltetracarboxylic dianhydride and oxydiphthalic dianhydride are used in combination in a molar ratio of 3,3',4,4'-biphenyltetracarboxylic dianhydride:oxydiphthalic dianhydride of preferably 95:5 to 40:60, more preferably 90:10 to 50:50.

Thirdly, two tetracarboxylic acid components, i.e., pyromellitic dianhydride and oxydiphthalic dianhydride are used in combination in a molar ratio of pyromellitic dianhydride:oxydiphthalic dianhydride of preferably 95:5 to 60:40, more preferably 90:10 to 70:30.

Fourthly, three tetracarboxylic acid components, i.e., 3,3', 4,4'-biphenyltetracarboxylic dianhydride, pyromellitic dianhydride, and oxydiphthalic dianhydride are used in combination in a molar ratio of 3,3',4,4'-biphenyltetracarboxylic dianhydride:pyromellitic dianhydride:oxydiphthalic dianhydride in the range of preferably 20 to 60:20 to 40:20 to 40.

Alternatively, the tetracarboxylic acid components can have the following configuration from the viewpoint of providing high heat resistance and dimensional stability as well as more excellent high-temperature dimensional stability (coefficient of linear expansion in the temperature range of 50 to 500° C.) and higher viscosity stability as the polyimide precursor composition and thus obtaining a product more suitable for applications to display substrate materials, but any other configuration can be used.

First, two tetracarboxylic acid components, i.e., 3,3',4,4'-biphenyltetracarboxylic dianhydride and pyromellitic dianhydride are used in combination in a molar ratio of 3,3',4, 4'-biphenyltetracarboxylic dianhydride:pyromellitic dianhydride of preferably 99.5:0.5 to 95:5, more preferably 99:1 to 97:3.

Second, pyromellitic dianhydride alone is preferably used.

Thirdly, three tetracarboxylic acid components, i.e., 3,3', 4,4'-biphenyltetracarboxylic dianhydride, pyromellitic dianhydride, and 2,3,3',4-biphenyltetracarboxylic dianhydride are used in combination in a molar ratio of 3,3',4,4'-biphenyltetracarboxylic dianhydride:pyromellitic dianhydride: 2,3,3',4-biphenyltetracarboxylic dianhydride of preferably 85 to 95:0.5 to 2:3 to 14.5, more preferably 87 to 91:0.7 to 1.5:7.5 to 12.3.

<Polyimide Precursor Solution>

The polyimide precursor solution according to the present invention is a solution containing (a) polyimide precursor(s) represented by Chemical Formula (I) and/or Chemical Formula (II) below prepared by polymerizing the tetracarboxylic acid component and the diamine component; and an organic solvent. The polyimide precursor solution according to the present invention is suitably used for producing the polyimide film according to the present invention.

[Chem. 1]

(I)

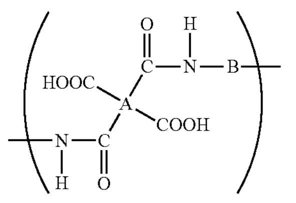

[Chem. 2]

(II)

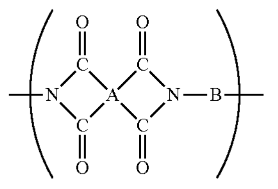

(where As are one or more tetravalent organic groups in which the carboxyl group is removed from a tetracarboxylic acid; Bs are one or more divalent organic groups in which the amino group is removed from diamine, and Bs at least partially contain a unit derived from DATP as the essential unit.)

Since the polyimide precursor solution contains DATP as the diamine component, it can be simply prepared by a traditionally known method. Although the method is not particularly limited, the polyimide precursor solution containing a polyimide precursor dissolved in a solvent can be prepared, for example, by reacting substantially equimolar amounts of tetracarboxylic dianhydride and diamine in a solvent at a relatively low temperature of 100° C. or less, preferably 80° C. or less to avoid excessive progress of the imidization reaction.

Although not particularly limited, generally, the polymerization temperature in preparation of the polyimide precursor solution is 25° C. or more and 100° C. or less, preferably 40° C. or more and 80° C. or less, more preferably 50° C. or more and 80° C. or less. The polymerization time is 0.1 hours or more and 24 hours or less, preferably 2 hours or more and 12 hours or less. By controlling the polymerization temperature and the polymerization time within the ranges above, a high molecular weight polyimide precursor solution can be easily prepared with high production efficiency. Although polymerization can also be performed under an atmosphere air, polymerization is suitably performed usually under an atmosphere of an inert gas, preferably a nitrogen gas. The expression "substantially equimolar amounts of tetracarboxylic dianhydride and diamine" specifically indicates that the molar ratio of these [the total tetracarboxylic acid components/the total diamine components] is 0.90 or more and 1.10 or less, preferably 0.95 or more and 1.05 or less, more preferably more than 0.98, 1.04 or less, 1.03 or less. In this specification, "approximately equivalent mole" means the molar ratio in the range of more than 0.99 to 1.01, and "equivalent mole" means the effective numeral of the molar ratio of 1.00.

The polyimide precursor(s) represented by Chemical Formula (I) and/or Chemical Formula (II) can be prepared by polymerizing the diamine component and the tetracarboxylic acid component. Usually, diamine is added to a polymerization apparatus containing a solvent. After it is confirmed that diamine is dissolved, the tetracarboxylic acid component is added. At this time, the tetracarboxylic acid component may be added in batch, or may be added in portions or continuously. By performing the imidization reaction in the solvent, the polyimide precursor according to the present invention can be prepared in the form of a solution, namely, a polyimide precursor solution.

Thus, the polyimide precursor solution according to the present invention can provide a polyimide film having high heat resistance and dimensional stability which is produced through a one-time polymerization step without blending polyimide precursors.

The solvent used in the polyimide precursor solution according to the present invention can be any solvent that enables polymerization of the polyimide precursor and can dissolve the polyimide precursor, and may be either a water solvent or an organic solvent. The solvent may be a mixture of two or more solvents, and a mixed solvent of two or more organic solvents or a mixed solvent of water and one or more organic solvents can also be used. Examples of organic solvents include, but not particularly limited to, N, N-dimethylformamide, N, N-dimethylacetamide, N, N-diethylacetamide, N-methyl-2-pyrrolidone, N-ethyl-2-pyrrolidone, 1,3-dimethyl-2-imidazolidinone, N-methylcaprolactam, hexamethylphosphorotriamide, 1,2-dimethoxyethane, bis(2-methoxyethyl) ether, 1,2-bis(2-methoxyethoxy) ethane, tetrahydrofuran, bis[2-(2-methoxyethoxy)ethyl]ether, 1,4-dioxane, dimethyl sulfoxide, dimethyl sulfone, diphenyl ether, sulfolane, diphenylsulfone, tetramethyl urea, anisole, m-cresol, phenol, γ-butyrolactone, and the like. The solvent used to polymerize the polyimide precursor can be used as it is as the solvent for the polyimide precursor solution when the polyimide film is produced.

Suitably, the logarithmic viscosity of the polyimide precursor measured at a temperature of 30° C. in a concentration of 0.5 g/100 ml is 0.2 or more, preferably 0.4 or more, particularly preferably 0.6 or more, although not particularly limited. When the logarithmic viscosity satisfies the ranges above, a polyimide film having excellent mechanical physical properties can be obtained.

The weight average molecular weight Mw of the polyimide precursor is preferably 10,000 or more and 500,000 or less, although not particularly limited. In particular, the weight average molecular weight Mw is preferably 50,000 or more, 70,000 or more, 100,000 or more, 300,000 or less, 200,000 or less, 150,000 or less. The molecular weight distribution Mw/Mn is preferably 15 or less, more preferably 10 or less, 7 or less, 5 or less, particularly preferably 1.5 or more and 4 or less. When the weight average molecular weight and the molecular weight distribution fall within these ranges above, a polyimide film having excellent high-temperature dimensional stability, heat resistance, and mechanical physical properties can be obtained. Here, the weight average molecular weight is determined based on the calibration curve produced using a known gel permeation chromatograph (GPC) from standard polystyrenes. The molecular weight distribution is the value obtained by calculation using the weight average molecular weight.

In the polyimide precursor solution, the solids concentration of the polyimide precursor is preferably 5% by mass or more and 45% by mass or less, more preferably 5% by mass or more and 40% by mass or less, still more preferably more than 10% by mass and 30% by mass or less relative to the total amount of the polyimide precursor and the solvent, although not particularly limited. When the solids concentration is less than 5% by mass, it may take some time and effort to increase the thickness of the film in some cases. When the solids concentration is more than 45% by mass, the solution viscosity may be excessively increased, leading to a necessity for a special film production apparatus in some cases.

The solution viscosity at 30° C. of the polyimide precursor solution used in the present invention is not limited, but is preferably 1000 Pa·sec or less, more preferably 0.5 Pa·sec or more and 500 Pa·sec or less, still more preferably 1 Pa·sec or more and 300 Pa·sec or less, particularly preferably 2 Pa·sec or more and 200 Pa·sec or less because of suitable handling.

To stably produce a polyimide film with high production efficiency, it is preferred that the polyimide precursor solution used in the present invention have high viscosity stability. Specifically, the viscosity stability can be expressed with a viscosity change rate, and based on the viscosity of the polyimide precursor solution held at 23° C. for 7 days, the viscosity of the polyimide precursor solution held at 23° C. for 31 days thereafter changes within preferably +5%, more preferably +2%.

The polyimide precursor solution may contain known additives, such as an amine compound, an additive for promoting the imidization reaction, such as a dehydrating agent, an organic phosphorus-containing compound, the above-mentioned filler, a surfactant, a silane coupling agent, and a leveling agent, as needed.

Examples of the amine compound include substituted or non-substituted nitrogen-containing heterocyclic compounds, N-oxide compounds of the nitrogen-containing heterocyclic compounds, substituted or non-substituted amino acid compounds, aromatic hydrocarbon compounds or aromatic heterocyclic compounds having a hydroxyl group, and the like. Specific examples of imidization catalysts include imidazole derivatives such as 1,2-dimethylimidazole, N-methylimidazole, 2-methylimidazole, 2-ethyl-4-methylimidazole, 5-methylbenzimidazole, and N-benzyl-2-methylimidazole; substituted pyridine derivatives such as isoquinoline, 3,5-dimethylpyridine, 3,4-dimethylpyridine, 2,5-dimethylpyridine, 2,4-dimethylpyridine, and 4-n-propylpyridine; and the like. Preferably, the amount of the imidization catalyst to be used is 0.01-fold equivalents or more and 2-fold equivalents or less, particularly 0.02-fold equivalents or more and 1-fold equivalent or less relative to amide acid units of polyamic acid. Use of the imidization catalyst may improve the physical properties of a polyimide film to be obtained, particularly elongation or end tear resistance.

Examples of other amine compounds include aliphatic tertiary amines such as trimethylamine and triethylenediamine; aromatic tertiary amines such as dimethylaniline; and heterocyclic tertiary amines such as isoquinoline, pyridine, α-picoline, and β-picoline; and the like, and these can be added as needed.

Examples of the dehydrating agent include aliphatic carboxylic anhydrides such as acetic anhydride, propionic anhydride, and butyric anhydride; aromatic carboxylic anhydrides such as benzoic anhydride; and the like.

Examples of the organic phosphorus-containing compound include phosphoric acid esters such as monocaproyl phosphoric acid ester, monooctyl phosphoric acid ester, monolauryl phosphoric acid ester, monomyristyl phosphoric acid ester, monocetyl phosphoric acid ester, monostearyl phosphoric acid ester, monophosphoric acid ester of triethylene glycol monotridecyl ether, monophosphoric acid ester of tetraethylene glycol monolauryl ether, monophosphoric acid ester of diethylene glycol monostearyl ether, dicaproyl phosphoric acid ester, dioctyl phosphoric acid ester, dicapryl phosphoric acid ester, dilauryl phosphoric acid ester, dimyristyl phosphoric acid ester, dicetyl phosphoric acid ester, distearyl phosphoric acid ester, diphosphoric acid ester of tetraethylene glycol mononeopentyl ether, diphosphoric acid ester of triethylene glycol monotridecyl ether, diphosphoric acid ester of tetraethylene glycol monolauryl ether, and diphosphoric acid ester of diethylene glycol monostearyl ether; and amine salts of these phosphoric acid esters. Examples of the amine include ammonia, monomethylamine, monoethylamine, monopropylamine, monobutylamine, dimethylamine, diethylamine, dipropylamine, dibutylamine, trimethylamine, triethylamine, tripropylamine, tributylamine, monoethanolamine, diethanolamine, triethanolamine, and the like.

<Method of Producing Polyimide Film>

The polyimide film according to the present invention can be produced using the polyimide precursor solution by a known method. Although the production method is not particularly limited, any of production methods (1) to (4) is preferred. The term "self-supporting film" used in this specification refers to a film obtained by applying a solution of (a) polyimide precursor(s) having (a) structure(s) represented by Chemical Formula (I) and/or Chemical Formula (II) onto a support, drying the solution to prepare a laminate of a polyimide precursor film and the support, and peeling the polyimide precursor film off therefrom, irrespective of whether the film is chemically or thermally imidized or not or whether the film is subjected to a further heat treatment or not.

[Production Method (1)]

A method of obtaining a polyimide film by applying a polyimide precursor solution containing a polyimide precursor represented by Chemical Formula (I) onto a support, drying the solution to prepare a laminate of the support and a polyimide precursor film, chemically or thermally imidizing the laminate, and then peeling the resulting polyimide film off from the support.

[Production Method (2)]

A method of obtaining a polyimide film by applying a polyimide precursor solution containing a polyimide precursor represented by Chemical Formula (I) onto a support, drying the solution, peeling the polyimide precursor film off from the support to obtain a self-supporting film, fixing the self-supporting film, and chemically or thermally imidizing the self-supporting film.

[Production Method (3)]

A method of obtaining a polyimide film by applying a polyimide precursor solution containing a polyimide precursor represented by Chemical Formula (II) onto a support, drying the solution to prepare a laminate of the support and a polyimide precursor film, additionally heating the laminate as needed, and then peeling the resulting polyimide film off from the support.

[Production Method (4)]

A method of obtaining a polyimide film by applying a polyimide precursor solution containing a polyimide precursor represented by Chemical Formula (II) onto a support, drying the solution, peeling the polyimide precursor film off from the support to obtain a self-supporting film, and then additionally heating the self-supporting film as needed.

In the production methods (1) to (4), the laminate of a support and a polyimide precursor film is produced by applying a polyimide precursor solution onto a support, followed by drying to an extent that the resulting polyimide precursor film becomes self-supporting, for example, the resulting polyimide precursor can be peeled off from the support.

The method of applying a polyimide precursor solution onto a support in the production methods (1) to (4) can be any method that enables formation of a desired coating, and for example, a known method such as spin coating, screen printing, bar coater method, electrophoretic deposition, casting, or extrusion molding can be suitably used. Considering the subsequent steps of drying, heating, and the like to formation of a polyimide film, for example, the coating can be formed into a thickness of about 1 μm to 500 μm.

Although the drying conditions in the production methods (1) to (4) are not particularly limited, it is preferred that drying be performed in the temperature range of 20° C. or more and 200° C. or less, room temperature (25° C.) or more and 180° C. or less, 30° C. or more and 150° C. or less. The time for drying can be 1 minute or more and 60 minutes or less, preferably 30 minutes or less, 20 minutes or less, although it varies depending on the heating temperature. The heating method is not particularly limited, for example, hot air, infrared light, or the like can be used; the heating method may be performed several times, or may be performed while the temperature is being gradually increased. The drying conditions can be selected considering the properties of the polyimide film such as in vacuum or under an atmosphere of an inert gas, such as nitrogen, or air.

Although the support to which the polyimide precursor solution is applied in the production methods (1) to (4) can be any support to which the polyimide precursor solution can be applied and which does not affect formation of the polyimide precursor film by subsequent drying, heating, and the chemical or thermal imidization reaction, use of a glass, metal, or plastic substrate is preferred.

The production methods (1) and (2) involve a chemical or thermal imidization step to obtain a polyimide film. The chemical or thermal imidization may be performed on the laminate of the support and the polyimide precursor film as in (1), or may be performed as in (2) after the polyimide precursor film is peeled off from the support to obtain a self-supporting film. Usually, the chemical or thermal imidization can be performed by performing a heat treatment.

An example of the thermal imidization will be described: Generally, the highest heating temperature in the heat treatment is 350° C. or more, preferably 450° C. or more, more preferably 490° C. or more, still more preferably 500° C. or more, particularly preferably 510° C. or more. When the highest heating temperature is 510° C. or more, the coefficient of linear expansion of the polyimide film can be further reduced. The upper limit of the heat treatment temperature can be a temperature which does not cause a reduction in properties of the polyimide film, and is preferably 600° C. or less, more preferably 550° C. or less. Although the heat treatment can also be performed under an air atmosphere, usually, the heat treatment is suitably performed under an atmosphere of an inert gas, preferably nitrogen gas. In the chemical imidization, the heat treatment can be performed on a condition milder than that for the thermal imidization although it depends on the type of an additive such as a chemical imidization catalyst. For example, the heat treatment can be performed in the temperature range of 100° C. or more, 120° C. or more, 150° C. or more, 200° C. or more, 500° C. or less, 450° C. or less, 400° C. or less, or 360° C. or less.

In particular, although there is no particular limitation when the polyimide film is used as a display substrate material, it is desired that drying be performed in the temperature range of 50° C. to 150° C., and then the heat treatment be performed at a highest heating temperature of 150° C. to 600° C., preferably 200° C. to 550° C., more preferably 250° C. to 500° C.

The heat treatment for the chemical or thermal imidization may be performed stepwise. For example, it is preferred that a first heat treatment be performed at a relatively low temperature of 100° C. to 170° C. for 0.5 to 30 minutes, a second heat treatment be then performed at a temperature of more than 170° C. to 220° C. or less for about 0.5 to 30 minutes, and subsequently, a third heat treatment be performed at a high temperature of more than 220° C. to less than 350° C. for about 0.5 to 30 minutes. Further, a fourth high-temperature heat treatment can be performed at 350° C. or more to the highest heating temperature. It is preferred that the heat treatment be continuously performed. For example, preferably, a heat treatment can be performed from a relatively low temperature of 100° C. to 170° C. to the highest heating temperature. Although the heating rate is not particularly limited, the heating rate is preferably 1° C./min or more and 30° C./min or less, particularly preferably 2° C./min or more and 20° C./min or less. The ranges above are preferred because foaming caused by a rapid increase in temperature can be suppressed.

In the production method (2), the self-supporting film can be chemically or thermally imidized based on a known method while being fixed with a pin tenter, a clip, a frame, or the like.

The production methods (3) and (4) involve a step of performing a heat treatment. The heat treatment step may be performed on the laminate of the support and the polyimide precursor film as in (3), or may be performed as in (4) after the polyimide precursor film is peeled off from the support to obtain a self-supporting film. The condition for the heat treatment is usually 150° C. or more, 180° C. or more, preferably 200° C. or more, and 300° C. or less, 270° C. or less, preferably 250° C. or less. The time for the heat treatment can be appropriately set depending on the heating temperature, and is preferably 1 minute or more, 10 minutes or more, 20 minutes or more, and preferably 24 hours or less, 12 hours or less, 1 hour or less, 30 minutes or less, for example.

In the production method (4), the self-supporting film can be subjected to the heat treatment while being fixed as in the production method (2).

Since the polyimide film according to the present invention contains DATP as the diamine component as described above, it can demonstrate high dimensional stability without being stretched. Further, desired physical properties can also be imparted to the polyimide film by orienting the polyimide film according to the application of the polyimide film by stretching the self-supporting film in the longitudinal direction (the so-called MD direction) and/or the traverse direction (the so-called TD direction).

Since the polyimide film obtained in the present invention has high heat resistance and dimensional stability, it can be suitably used as a heat-resistant layer (core layer) for a film for a metal laminate in a circuit substrate such as a high-frequency circuit substrate, for example. When the polyimide film according to the present invention is used in applications to circuit substrates, preferably, the polyimide film also includes low saturated water absorption and/or low water vapor permeability in addition to high heat resistance and excellent high-temperature dimensional stability because such a polyimide film can be used more suitably in applications to circuit substrates.

The film for a metal laminate usually includes a heat-resistant layer and a metal adhesive layer disposed on one or both surfaces thereof. The metal adhesive layer is a layer used to bond a metal layer to the heat-resistant layer made of the polyimide film according to the present invention. Examples of one embodiment of the film for a metal laminate including the polyimide film according to the present invention include a film for a metal laminate including a metal adhesive layer formed of a thermally adhesive (thermoplastic) polyimide having Tg of less than 290° C., preferably 250° C. or less, particularly preferably 200° C. or less, and disposed on one or both surfaces of the polyimide film according to the present invention. Examples of another embodiment thereof include a film for a metal laminate including a metal adhesive layer formed by applying a coating solution containing a silane coupling agent onto one or both surfaces of the polyimide film according to the present invention. In this exemplary film for a metal laminate, the coating solution may be applied onto the surface(s) of the thermally adhesive polyimide layer, or the metal adhesive layer may be formed using a mixture of the thermally adhesive polyimide and the coating solution.

The polyimide film according to the present invention can also be suitably used for substrates for displays such as displays and touch panels and substrates for solar batteries. As one example, a substrate for a display including the polyimide film according to the present invention will be described. Since the polyimide film according to the present invention has high heat resistance and dimensional stability, it can be suitably used in applications to substrates for displays. When the polyimide film according to the present invention is used in applications to substrates for displays, it particularly preferably satisfies a coefficient of linear expansion in the temperature range of 50 to 500° C. (namely, high-temperature dimensional stability) of −1.0 ppm/K or more and less than +0.5 ppm/K because it can be used more suitably used in applications to substrates for displays.

For the substrate for a display, for example, a flexible conductive substrate (substrate for a flexible electronic device) composed of a conductive layer/a polyimide film laminate or a conductive layer/a polyimide film laminate/a conductive layer can be obtained by forming an electrically conductive layer of a conductive substance (such as a metal or a metal oxide, a conductive organic product, or conductive carbon) on the surface of the polyimide film according to the present invention. Before the electrically conductive layer is formed on the surface of the polyimide film, an inorganic layer such as a gas barrier layer against water vapor or oxygen or a light adjustment layer may be formed by sputtering, deposition, a gel-sol method, or the like as needed. At this time, the polyimide film according to the present invention may be used as a laminate of the polyimide film laminated on the glass substrate.

In the electrically conductive layer, a circuit is suitably formed by a method such as photolithography, a variety of printing methods, or an inkjet method.

The substrate for a display according to the present invention thus obtained includes a circuit of the electrically conductive layer on the surface of the polyimide film configured of the polyimide according to the present invention with an optional gas barrier layer or an inorganic layer interposed therebetween. Since this substrate has high heat resistance and dimensional stability, a fine circuit is readily formed. When a polyimide film having low water absorption or a low water vapor permeability coefficient is used, it can prevent permeation of the water content to displays and the like. Accordingly, this substrate can also be suitably used as a substrate for displays such as displays and touch panels or a substrate for solar batteries by mounting a variety of elements.

EXAMPLES

Hereinafter, the present invention will be more specifically described by way of Examples, Comparative Examples, and Reference Examples, but the present invention is not limited to these.

Measurement methods used in examples below will be shown.

<Glass Transition Temperature>

Using an RSA G2 type dynamic rheometer available from TA INSTRUMENTS, a polyimide film was subjected to dynamic viscoelastic analysis at a heating rate of 10° C./min and a frequency of 1 Hz, and the tan δ peak temperature was defined as the glass transition temperature. When the tan δ peak was not clearly observed even if the measurement was performed by heating to 500° C., the glass transition temperature was defined as "more than 500° C.".

<Coefficient of Linear Expansion 1>

Using EXSTAR 6100 available from SII Inc., a sampled polyimide film with a length of 15 mm, a width of 3 mm, and a thickness of 25 μm was measured in a tensile mode under a load of 4 gf at a heating rate of 20° C./min, and was subjected to primary heating to 300° C. to remove heat shrinkage during film formation. Subsequently, the polyimide film was spontaneously cooled to room temperature, was measured at 20° C./min to 300° C. as secondary heating, and the coefficient of linear expansion was calculated from the TMA curve from 50° C. to 200° C.

<Coefficient of Linear Expansion 2>

Using EXSTAR 6100 available from SII Inc., a sampled polyimide film with a length of 15 mm, a width of 3 mm, and a thickness of 10 μm was measured in a tensile mode under a load of 4 gf at a heating rate 20° C./min, and was subjected to primary heating to 500° C. to remove heat shrinkage during film formation. Subsequently, the polyimide film was spontaneously cooled to room temperature, was measured at 20° C./min to 500° C. as secondary heating, and the coefficient of linear expansion was calculated from the TMA curve from 50° C. to 500° C.

<Saturated Water Absorption>

A polyimide film was immersed in water at 23° C. for 24 hours or longer to absorb water into saturation, and the saturated water absorption was calculated from the absolute dry weight and the weight at saturation of water absorption using the following formula:

$$\text{saturated water absorption}(\%) = [(\text{weight after saturation of water absorption}) - (\text{absolute dry weight})]/(\text{absolute dry weight}) \times 100$$

<Water Vapor Permeability Coefficient>

The water vapor permeability of a polyimide film was measured at 40° C. and a relative humidity of 90% according to the method B specified in JIS K7129. The water vapor permeability coefficient was calculated from the measured water vapor permeability.

water vapor permeability coefficient=water vapor permeability×film thickness

<Viscosity Stability>

Based on the viscosity change rate of the solution viscosity of a polyamic acid solution after held at 23° C. for 31 days relative to that of the polyamic acid solution after held at 23° C. for 7 days, a sample having a viscosity change rate of +2% or less was ranked as "o" (Good), a sample having a viscosity change rate of +5% or less was ranked as "A" (Fair), and a sample having a viscosity change rate out of these ranges was ranked as "x" (Poor).

The viscosity was measured at a measurement temperature of 30° C. using an E type viscometer.

<Average Molecular Weight, Molecular Weight Distribution>

The weight average molecular weight Mw and the number average molecular weight Mn were measured under the following conditions, and the molecular weight distribution Mw/Mn was calculated from the obtained Mw and Mn.

apparatus: HLC-8320 GPC available from Tosoh Corporation
column: TSKgel Super AWM-H available from Tosoh Corporation, 9 μm 6.0 mm I.D.×15 cm
eluent: NMP (10 mmol/L of Licl, 30 mmol/L of phosphoric acid)
measurement temperature: 40° C.
flow rate: 0.5 mL/min
detection method: RI
amount measured: 20 μl Abbreviations of compounds used in Examples below are shown below:

s-BPDA: 3,3',4,4'-biphenyltetracarboxylic dianhydride
a-BPDA: 2,3,3',4-biphenyltetracarboxylic dianhydride
PMDA: 1,2,4,5-benzenetetracarboxylic dianhydride (pyromellitic dianhydride)
ODPA: 4,4'-oxydiphthalic dianhydride
PPD: p-phenylenediamine
ODA: 4,4'-diaminodiphenyl ether
MPD: m-phenylenediamine
BAF: 9,9-bis(4-aminophenyl) fluorene
DATP: 4,4"-diamino-p-terphenyl
TPE-R: 1,3-bis(4-aminophenoxy)benzene
TPE-Q: 1,4-bis(4-aminophenoxy)benzene
Bisaniline P: 1,4-bis[2-(4-aminophenyl)-2-propyl]benzene
BAPB: 4,4'-bis(4-aminophenoxy) biphenyl
BAPP: 2,2-bis[4-(4-aminophenoxy)phenyl]propane
DMAC: N, N-dimethylacetamide
NMP: N-methyl-2-pyrrolidone

Example 1

DMAc was placed into a reactor equipped with a stirrer and a nitrogen inlet pipe, and further DATP was added as a diamine component. Subsequently, equimolar amounts of s-BPDA and PMDA to the diamine component were added as tetracarboxylic dianhydride components to perform a reaction, thus preparing a polyamic acid solution having a monomer concentration of 18% by mass and a solution viscosity at 30° C. of 1800 poise. The molar ratio of s-BPDA to PMDA (s-BPDA: PMDA) was 10:90. The resulting polyamic acid solution was casted onto a glass plate to form a thin film, and the workpiece was heated at 120° C. for 12 minutes using an oven. Then, the film was peeled off from the glass plate to obtain a self-supporting film. Four sides of the self-supporting film were fixed with a pin tenter, and the self-supporting film was gradually heated from 150° C. to 450° C. (the highest heating temperature was 450° C.) in a heating furnace to remove the solvent and perform imidization. Thus, a polyimide film having a thickness of 25 μm was obtained. The results of evaluations are shown in Table 1.

Examples 2 to 22, Comparative Examples 1 to 4

Polyimide films were obtained in the same manner as in Example 1 except that the types and proportions of the acid anhydride(s) and the diamine(s) for each polyamic acid were varied as shown in Table 1. The results of evaluations are shown in Tables 1 and 2.

TABLE 1

| | Tetracarboxylic dianhydride | | | Diamine | | | | | | |
|---|---|---|---|---|---|---|---|---|---|---|
| | s-BPDA | PMDA | ODPA | DATP | PPD | TPE-R | TPE-Q | Bisaniline P | BAPB | BAPP |
| Example 1 | 1 | 9 | | 10 | | | | | | |
| Example 2 | 3 | 7 | | 10 | | | | | | |
| Example 3 | 5 | 5 | | 10 | | | | | | |
| Example 4 | 7 | 3 | | 10 | | | | | | |
| Example 5 | 9 | | 1 | 10 | | | | | | |
| Example 6 | 5 | | 5 | 10 | | | | | | |
| Example 7 | | 9 | 1 | 10 | | | | | | |
| Example 8 | | 7 | 3 | 10 | | | | | | |
| Example 9 | 6 | 2 | 2 | 10 | | | | | | |
| Example 10 | 4 | 4 | 2 | 10 | | | | | | |
| Example 11 | 3.3 | 3.3 | 3.3 | 10 | | | | | | |
| Example 12 | 2 | 8 | | 7 | 3 | | | | | |
| Example 13 | 3 | 7 | | 7 | 3 | | | | | |
| Example 14 | 3 | 7 | | 2 | 8 | | | | | |
| Example 15 | 3 | 7 | | 5 | 5 | | | | | |
| Example 16 | 8 | 2 | | 2 | 8 | | | | | |
| Example 17 | 8 | 2 | | 1 | 9 | | | | | |
| Example 18 | 6 | 4 | | 9 | | 1 | | | | |
| Example 19 | 6 | 4 | | 9 | | | 1 | | | |
| Example 20 | 6 | 4 | | 9 | | | | 1 | | |
| Example 21 | 6 | 4 | | 9 | | | | | 1 | |
| Example 22 | 6 | 4 | | 9 | | | | | | 1 |

TABLE 1-continued

| | Results of evaluations | | | |
|---|---|---|---|---|
| | Glass transition temperature [° C.] | Coefficient of linear expansion at 50-200° C. [ppm/K] | Saturated water absorption [mass %] | Water vapor permeability coefficient [g · mm/(m$^2$ · 24 h)] |
| Example 1 | 434 | <0.1 | 1.49 | 0.08 |
| Example 2 | 462 | 2.9 | 1.09 | 0.04 |
| Example 3 | 371 | 3.8 | 0.86 | 0.01 |
| Example 4 | 350 | 5.3 | 0.75 | 0.01 |
| Example 5 | 312 | 7.7 | 0.80 | — |
| Example 6 | 295 | 10 | 0.72 | — |
| Example 7 | 457 | 3.6 | 1.65 | — |
| Example 8 | 461 | 6 | 1.40 | — |
| Example 9 | 335 | 4.1 | 0.70 | — |
| Example 10 | 356 | 4.6 | 0.65 | — |
| Example 11 | 345 | 5.9 | 0.87 | — |
| Example 12 | 465 | 2.6 | 1.46 | 0.10 |
| Example 13 | 404 | 2.6 | 1.36 | 0.08 |
| Example 14 | 464 | 3.6 | 1.78 | 0.28 |
| Example 15 | 400 | 3.9 | 1.32 | — |
| Example 16 | 381 | 9.7 | 1.31 | — |
| Example 17 | 385 | 9.7 | 1.38 | — |
| Example 18 | 339 | 7.5 | 0.81 | — |
| Example 19 | 345 | 5.5 | 0.87 | — |
| Example 20 | 360 | 6.4 | 1.00 | — |
| Example 21 | 343 | 6.4 | 0.87 | — |
| Example 22 | 350 | 7.2 | 0.93 | — |

In Table 1, the amounts of the acid anhydride(s) and the diamine(s) for each polyamic acid are expressed as molar amounts, and "-" indicates "not measured".

TABLE 2

| | Tetracarboxylic dianhydride | | | Diamine | | | | | | |
|---|---|---|---|---|---|---|---|---|---|---|
| | s-BPDA | PMDA | ODPA | DATP | PPD | TPE-R | TPE-Q | Bisaniline P | APBP | BAPP |
| Comp. Ex. 1 | 3 | | 7 | 10 | | | | | | |
| Comp. Ex. 2 | | 5 | 5 | 10 | | | | | | |
| Comp. Ex. 3 | 8 | 2 | | 0.5 | 9.5 | | | | | |
| Comp. Ex. 4 | 10 | | | 10 | | | | | | |

| | Results of evaluations | | | |
|---|---|---|---|---|
| | Glass transition temperature [° C.] | Coefficient of linear expansion at 50-200° C. [ppm/K] | Saturated water absorption [mass %] | Water vapor permeability coefficient [g · mm/(m$^2$ · 24 h)] |
| Comp. Ex. 1 | 301 | 19 | 0.78 | — |
| Comp. Ex. 2 | 350 | 11 | 1.17 | — |
| Comp. Ex. 3 | 390 | 11 | 1.49 | — |
| Comp. Ex. 4 | 290 | 5.8 | 0.93 | 0.05 |

In Table 2, the amounts of the acid anhydride(s) and the diamine(s) for each polyamic acid are expressed as molar amounts, and "-" indicates "not measured".

The obtained polyimide films were evaluated for glass transition temperature and coefficient of linear expansion in the temperature range of 50° C. to 200° C., which revealed that the polyimide films according to Examples 1 to 22 all had a high glass transition temperature and a low coefficient of linear expansion, that is, high heat resistance and dimensional stability.

Example 23

NMP was placed into a reactor equipped with a stirrer and a nitrogen inlet pipe, and further DATP was added as a diamine component. Subsequently, substantially equimolar amounts of S-BPDA and PMDA to the diamine components were added as tetracarboxylic dianhydride components to perform a reaction. Thus, a polyamic acid solution having a monomer concentration of 10% by mass and a solution viscosity at 30° C. of 76.0 poise was prepared. The molar ratio of s-BPDA:PMDA:DATP was 97:3:100. The prepared polyamic acid solution was applied onto an alkali-free glass wafer by spin coating, and the workpiece was heated for 10 minutes at each of 120° C., 150° C., 200° C., and 250° C. and for 5 minutes at 450° C. to form a polyimide film having a thickness of 10 μm. Thus, a polyimide/glass laminate was produced. The polyimide film peeled off from the glass was evaluated, and the results are shown in Table 3.

Examples 24 to 29, Comparative Example 5, Reference Examples 1 to 5

Polyimide films were obtained in the same manner as in Example 23 except that the types and proportions of the acid anhydride(s) and the diamine(s) for each polyamic acid were varied as shown in Table 3. The results of evaluations are shown in Table 3.

For this reason, it can be said that the polyimide precursor solutions according to the present invention have a good balance of heat resistance and mechanical strength.

TABLE 3

| | Tetracarboxylic dianhydride | | | Diamine | | | | | | Results of evaluations | |
|---|---|---|---|---|---|---|---|---|---|---|---|
| | | | | | | | | | | Glass transition temperature | Coefficient of linear expansion at 50-500° C. |
| | s-BPDA | PMDA | a-BPDA | DATP | PPD | ODA | BAPB | BAFL | MPD | [° C.] | [ppm/K] |
| Example 23 | 9.7 | 0.3 | | 10 | | | | | | 310 | −0.09 |
| Example 24 | 9.9 | 0.1 | | 8.9 | 0.1 | 1 | | | | 325 | −0.89 |
| Example 25 | 9.9 | 0.1 | | 8.9 | 0.1 | | 1 | | | 317 | −0.69 |
| Example 26 | 8.9 | 0.1 | 1 | 9.9 | 0.1 | | | | | 342 | −0.95 |
| Example 27 | | 10 | | 9.5 | | | | | 0.5 | More than 500° C. | −0.18 |
| Example 28 | | 10 | | 8.5 | | | | 1.5 | | More than 500° C. | 0.14 |
| Example 29 | | 10 | | 9.5 | | | 0.5 | | | More than 500° C. | −0.74 |
| Comp. Ex. 5 | 10 | | | 10 | | | | | | 316 | −1.26 |
| Ref. Ex. 1 | | 10 | | 10 | | | | | | More than 500° C. | −2.05 |
| Ref. Ex. 2 | 10 | | | | 10 | | | | | 321 | −4.86 |
| Ref. Ex. 3 | 9.8 | | | 3 | 7 | | | | | — | 5.2 |
| Ref. Ex. 4 | 5 | 5 | | 7 | 3 | | | | | 370 | −6.37 |
| Ref. Ex. 5 | | 9.8 | | 2 | 8 | | | | | More than 500° C. | −5.03 |

In Table 3, the amounts of the acid anhydride(s) and the diamine(s) for each polyamic acid are expressed as molar amounts, "-" indicates "not measured", and "more than 500° C." indicates that the tan δ peak was not clearly observed even if the measurement of the glass transition temperature was performed by heating to 500° C.

The obtained polyimide films were evaluated for glass transition temperature and coefficient of linear expansion in the temperature range of 50° C. to 500° C., which revealed that the polyimide films according to Examples 1 to 22 all had a high glass transition temperature and a low coefficient of linear expansion, that is, high heat resistance and high-temperature dimensional stability. In all of Examples 23 to 39, the coefficient of linear expansion from 50° C. to 200° C. was within the range of −5 ppm/K or more and 10 ppm/K or less. In Comparative Example 5 and Reference Examples 1 to 5, the coefficient of linear expansion in the temperature range of 50° C. to 500° C. was out of the range of −1.0 ppm/K or more and less than +0.5 ppm/K, and the polyimide films were not suitable for applications to the material for display substrates.

The viscosity stability was measured in Examples 23 and 29, Comparative Example 5, and Reference Example 1. The results are shown in Table 4. The results in Table 4 clearly show that the polyimide precursor solutions according to the present invention had significantly high storage stability.

TABLE 4

| | Viscosity at 23° C. after 7 days Poise@30° C. | Viscosity at 23° C. after 31 days Poise@30° C. | Viscosity stability |
|---|---|---|---|
| Example 23 | 370 | 373 | ○ |
| Example 29 | 296 | 293 | ○ |
| Comp. Ex. 5 | 403 | 378 | x |
| Ref. Ex. 1 | 335 | 328 | Δ |

The molecular weight distribution was measured in Examples 1 to 29, in all of which the molecular weight distribution (Mw/Mn) was 5 or less (in particular, Mw/Mn was 1.5 or more and 4 or less in most of Examples 1 to 29).

The invention claimed is:

1. A polyimide film comprising a polyimide prepared by reacting a tetracarboxylic acid component with a diamine component containing 4,4"-diamino-p-terphenyl, wherein the polyimide film has a glass transition temperature of 300° C. or more, a coefficient of linear expansion in the temperature range of 50° C. to 200° C. of 6 ppm/K or less, and any one of the following (A) to (C) applies:

(A) the tetracarboxylic acid component includes 10 to 30 mol % of 3,3',4,4'-biphenyltetracarboxylic dianhydride (s-BPDA) and 70 to 90 mol % of pyromellitic dianhydride (PMDA) in the total tetracarboxylic acid components, and the diamine component includes 50 mol % or more of 4,4"-diamino-p-terphenyl (DATP) in the total diamine components, (B) the tetracarboxylic acid component includes 70 to 90 mol % of pyromellitic dianhydride (PMDA) and 30 to 10 mol % of oxydiphthalic dianhydride (ODPA) in the tetracarboxylic acid components, and the diamine component includes 50 mol % or more of 4,4"-diamino-p-terphenyl (DATP) in the total diamine components, and (C) the tetracarboxylic acid component includes 10 to 30 mol % of 3,3',4,4'-biphenyltetracarboxylic dianhydride (s-BPDA) and 70 to 90 mol % of pyromellitic dianhydride (PMDA) in the total tetracarboxylic acid components, and the diamine component includes 10 to 70 mol % of 4,4"-diamino-p-terphenyl (DATP) and 90 to 30 mol % of p-phenylenediamine (PPD) in the total diamine components.

2. The polyimide film according to claim 1, wherein the polyimide film has a saturated water absorption of 1% or less.

3. The polyimide film according to claim 1, wherein the polyimide film has a water vapor permeability coefficient of 0.1 g·mm/(m2·24 h) or less.

4. The polyimide film according to claim 1, wherein the polyimide film has a coefficient of linear expansion in the temperature range of 50° C. to 500° C. of −1.0 ppm/K or more and less than 0.5 ppm/K.

5. The polyimide film according to claim 1, wherein (A) or (B) applies and the diamine component in (A) or (B)

includes 90 to 100 mol % of 4,4"-diamino-p-terphenyl (DATP) in the total diamine components.

6. The polyimide film according to claim 5, wherein the diamine component in (A) or (B) includes 100 mol % of 4,4"-diamino-p-terphenyl (DATP) in the total diamine components.

7. A polyimide precursor solution for producing the polyimide film according to claim 1.

8. A polyimide film for a metal laminate, comprising a metal adhesive layer disposed on the polyimide film according to claim 1.

9. A polyimide-metal laminate, comprising the polyimide film for a metal laminate according to claim 8 and a metal layer laminated on the polyimide film.

10. A high-frequency circuit substrate, comprising the polyimide-metal laminate according to claim 9.

11. A laminate, in which the polyimide film according to claim 1 and a glass substrate are laminated.

12. A substrate for a flexible electronic device, comprising the polyimide film according to claim 1.

13. A substrate for a flexible electronic device, comprising the substrate for a flexible electronic device according to claim 12 and an element on the substrate.

14. A method of producing a flexible electronic device comprising a substrate for a flexible electronic device and an element on the substrate, the method comprising:

applying the polyimide precursor solution according to claim 8 onto a carrier substrate;

forming a polyimide film by a heat treatment of the carrier substrate onto which the polyimide precursor solution is applied;

forming an element on the polyimide film; and peeling the polyimide film including the element formed thereon from the carrier substrate.

15. A substrate for a flexible electronic device, comprising the laminate according to claim 11.

* * * * *